United States Patent [19]

Fisher

[11] Patent Number: 4,759,491
[45] Date of Patent: Jul. 26, 1988

[54] METHOD AND APPARATUS FOR APPLYING BONDING MATERIAL TO COMPONENT LEADS

[75] Inventor: John R. Fisher, Belle Mead, N.J.

[73] Assignee: American Telephone and Telegraph Company, New York, N.Y.

[21] Appl. No.: 50,359

[22] Filed: May 18, 1987

[51] Int. Cl.⁴ .......................... B23K 1/20; B23K 3/00; B23K 31/02

[52] U.S. Cl. .................. 228/180.2; 228/56.1; 228/256; 228/259; 228/119; 228/191; 118/225; 118/255; 427/282

[58] Field of Search ................. 228/180.2, 180.1, 56.1, 228/256, 259, 119, 191, 264; 118/216, 225, 255; 427/88, 120, 123, 272, 277, 282

[56] References Cited

U.S. PATENT DOCUMENTS

| | | | |
|---|---|---|---|
| 4,396,140 | 8/1983 | Jaffe et al. | 228/180.2 |
| 4,439,918 | 4/1984 | Carroll et al. | 29/840 |
| 4,638,938 | 1/1987 | Yarne et al. | 228/180.2 |
| 4,646,435 | 3/1987 | Grassauer | 228/180.2 |
| 4,657,172 | 4/1987 | Lee | 228/180.2 |

FOREIGN PATENT DOCUMENTS

| | | | |
|---|---|---|---|
| 2714483 | 10/1978 | Fed. Rep. of Germany | 228/180.2 |
| 2728330 | 1/1979 | Fed. Rep. of Germany | 228/180.2 |
| 710793 | 1/1980 | U.S.S.R. | 228/180.2 |

OTHER PUBLICATIONS

J. Lyman, "Sized Solder Bumps Make Solid Joints", *Electronics*, pp. 46, 48, Nov. 3, 1981.

W. O. Druschel and C. G. Metreaud, IBM Technical Disclosure Bulletin, vol. 21, Nov. 1978.

Primary Examiner—Nicholas P. Godici
Assistant Examiner—Samuel M. Heinrich
Attorney, Agent, or Firm—Robert B. Levy

[57] ABSTRACT

A controlled amount of a solder is applied to the tip (18) of each lead (14) of a multi-lead component (10) by first placing a solder sphere (30) in each of a plurality of cavities (24) arranged in a baseplate (22) in the same pattern as the tips of the leads. Thereafter, the tips of the leads of the component are placed in contact with the solder spheres while, at the same time, at least a pair of leads are each engaged by a separate one of a pair of alignment pins (32) rising upwardly from the baseplate. The alignment pins serve to constrain the lateral movement of the component, thereby maintaining the leads thereof in alignment with the solder spheres when the solder spheres are reflowed to bond to the tips of the leads.

16 Claims, 3 Drawing Sheets

METHOD AND APPARATUS FOR APPLYING BONDING MATERIAL TO COMPONENT LEADS

TECHNICAL FIELD

This invention relates to a method and apparatus for applying a controlled amount of bonding material (e.g., solder) to the tips of the leads of a multi-leaded component.

BACKGROUND OF THE INVENTION

Currently, the trend in the electronics industry is toward producing electronic equipment containing surface mount components. Surface mount components are electronic devices, such as transistors, resistors, chip carriers and the like which are designed for mounting directly to metallized areas on a major surface of a printed circuit board, in contrast to "through hole" type components which have their leads inserted through and solder bonded to metal-plated apertures in the board. Presently, there are two types of surface mount components, those which are "leaded" and those which are "leadless." Leaded surface-mount components have leads which are directly connected to the metallized areas on the printed circuit board. Leadless surface mount components are connected to the metallized areas on the printed circuit board by metallized pads on the exterior of the case of the component.

Although careful efforts are made at screening defective surface mount components prior to their being soldered to a printed circuit board, nonetheless, it is not unusual for a defective component to escape such screening and be mounted on the circuit board. Then, to repair the circuit board, the defective component must be removed and a replacement component soldered in its place. In the past, soldering of either leaded or leadless replacement components to the board has been accomplished by using a syringe to apply fresh solder paste to the metallized pads on the circuit board formerly bonded to the defective component. Unfortunately, the solder paste applied by the syringe tends to be uneven, yielding solder joints of poor quality.

Alternatively, in the case of a leadless component, a controlled amount of solder can be applied to the pads on the component case to allow the component to be soldered in place of the one which is defective without the need to apply solder paste to the circuit board. A controlled amount of solder can be applied to the metallized pads on a replacement leadless surface mount component by first placing the component in a fixture in intimate contact with a baseplate having a plurality of cavities therein arranged in a pattern the same as that of the pads on the case of the component. The fixture aligns the leadless component such that each metallized pad is contiguous with a solder sphere seated in a separate one of the cavities. The solder spheres are then reflowed so each bonds to a separate one of the metallized pads on the component, causing each pad to have a mass or "bump" of solder depending therefrom. Following the reflow operation, the pads on the leadless component are said to have been "bumped".

During the process of bumping the pads on the leadless surface mount component, the surface tension of the reflowed solder spheres is sufficient to cause the pads to self-align with the solder spheres. The self-alignment between the pads and the solder spheres compensates for small positioning errors that may initially exist therebetween. However, if one were to try to bump the leads of a leaded device in the same manner as the pads on the leadless component, one would find the surface tension of the solder spheres to be insufficient to cause the tips of the leads to self-align with the solder spheres. Thus, no compensation would be provided for any initial positioning errors which may exist between the lead tips and the solder spheres. The tips of the leads of the leaded component are arcuate in shape and would tend to slide off the solder spheres when placed thereon, often giving rise to an initial positioning error between the lead tips and the solder spheres.

Therefore, there is a need for a technique for applying a controlled amount of solder to the tips of the leads of a leaded component which assures that lead tips remain aligned with the solder spheres during the reflow thereof.

SUMMARY OF THE INVENTION

A controlled amount of bonding material (e.g., solder) can be applied to the tips of the leads of a multi-lead leaded component by first placing a quantity of reflowable bonding material (e.g., a solder sphere) within each of a plurality of cavities arranged in a plate in the same pattern as that of the leads on the component. The leads of the component are then placed in contact with the bonding material in each of the cavities. As the leads are placed in contact with the bonding material, each of a pair of the leads is engaged by a separate one of a pair of alignment pins which rise upwardly from the plate adjacent to the cavities. The engagement of the alignment pins with the leads is such that the pins constrain the lateral movement of the component in all directions, thereby maintaining the tips of the leads in alignment with the bonding material. While the leaded component is thus constrained, the bonding material is then reflowed so as to attach to each lead.

DETAILED DESCRIPTION

Figure 1:
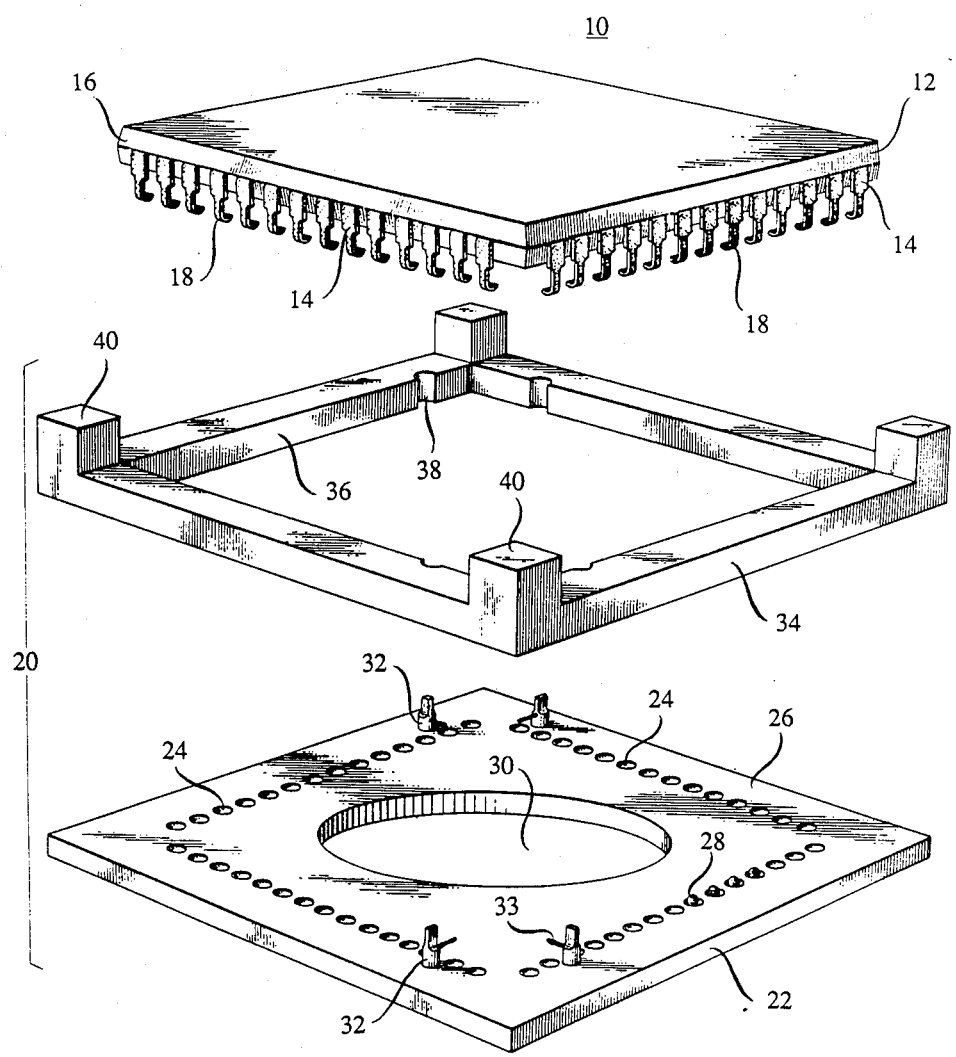
FIG. 1 is an exploded view of an apparatus for applying a controlled amount of solder to the tips of the leads of a leaded type surface mount component.
Figure 2:
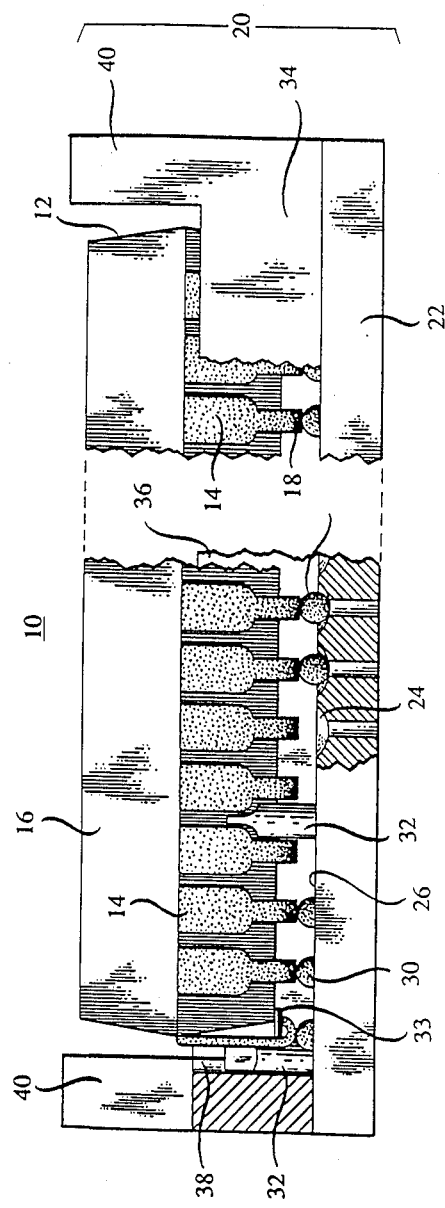
FIG. 2 is a partially cutaway side view of the apparatus of FIG. 1.

FIGS. 1 and 2 illustrate a leaded chip carrier 10, comprised of a square-shaped planar case 12. The case 12 contains a semiconductor chip (not shown) having a plurality of leads 14 connected thereto and extending out through each side 16 of the case so as to depend therefrom. Each lead 14 is typically "J" shaped, and has an arcuate tip 18 at the end thereof. Depending on the type of chip carrier 10, there may be as many as thirty-two or more leads 14 extending out from each side 16 of the case 12.

Also illustrated in FIGS. 1 and 2 is an apparatus 20, constructed in accordance with the teachings of the present invention, for applying a controlled amount of a bonding material (e.g., solder) to the tips 18 of the leads 14 of the chip carrier 10. The apparatus 20 comprises a baseplate 22, made from a metal, such as aluminum, which has been hardened by infusion of a synthetic resin therein, such as TEFLON resin manufactured by Du-Pont Co., Wilmington, Del. The infusion of the synthetic resin into the aluminum baseplate 22 serves not only to harden it, but greatly reduces the adherence of solder thereto as well.

The baseplate 22 has a plurality of cavities 24 of equal size arranged in a major surface 26 in the same pattern as that of the lead tips 18. As best seen in FIG. 1, the leads 14, and hence tips 18, typically each lie in a separate one of four rows arranged as a square. Hence, the cavities 24 are thus arranged in four rows comprising a separate square. The cavities 24 are each sized to seat a separate one of a plurality of flux-coated solder spheres 28, each of a volume on the order of the desired mass of the resultant solder bump to be present at each lead tip 18. A hole 30 (see FIG. 1) is provided through the baseplate 22 so as to lie centrally within the area bounded by the four rows of cavities 24.

Each of a plurality of alignment pins 32 rises upwardly from the surface 26 of the baseplate alongside of a separate one of the rows of cavities 24 and between a pair of cavities within the row. As shown in FIG. 2, the alignment pins 32 each have their upper end shaped to fit between and be captured by a pair of the leads 14 on the chip carrier 10 upon the placement of the chip carrier on the baseplate so each lead tip 18 contacts a separate solder sphere 28. The fit between one of the alignment pins 32 and a pair of the leads 14 constrains the chip carrier 10 against lateral movement in one direction along a single axis. When each of a pair of alignment pins 32 is captured between each of two pairs of leads 14, each extending from a separate one of a pair of chip carrier sides 16 which are opposite to, or at right angles to, each other, then the alignment pins will totally constrain all lateral movement of the chip carrier 10.

Preferably, each alignment pin 32 is provided with a finger 33 extending horizontally therefrom so as to underlie the chip carrier 10. The height of the finger 33 on each alignment pin 32, as measured from the surface 26, is such that when the chip carrier 10 is placed with its leads in contact with the solder spheres 30, the finger is spaced about 10 mils below the undersurface of the chip carrier. The fingers 33 on the alignment pins 32 serve to limit the descent of the lead tips 18 into the solder spheres 28 during the reflow thereof.

For aiding in the spacing and alignment of the chip carrier 10 prior to the reflow operation, the apparatus 20 also includes a square-shaped alignment template 34, which, as best shown in FIG. 1, has a square-shaped central opening 36 sized large enough to receive the chip carrier 10 therein. The opening 36 is provided with a plurality of half-cylindrical notches 38 in the periphery thereof, each notch having a radius on the order of the radius of each of the alignment pins 32. The notches 38 are positioned such that only when the alignment template 34 is placed on the baseplate 22 so each of the four rows of cavities 24 is equally spaced from a separate one of the sides of the opening 36, will the alignment pins 32 be received in the notches. Each of four stand-offs 40 rises upwardly from a separate one of the corners of the alignment template 30 above the height of the chip carrier 10. In this way, when the template 34, base plate 22 and the chip carrier 10 are inverted, and a shaft (not shown) is inserted through the hole 30, the stand-offs 40 constrain the chip carrier from tilting.

To apply a controlled amount of solder to the tips 18 of the leads 14 using the apparatus 20, a solder sphere 28 is first placed in each cavity 24. This may be accomplished by dropping a quantity of the solder spheres 28 onto the surface 26 of the baseplate 22 and then tilting the baseplate to allow those solder spheres which do not seat themselves in the cavities 24 to roll off the surface. Next, the template 34 is placed on the baseplate 22 so that each of the alignment pins 32 is received in a separate one of the notches 38. Thereafter, the chip carrier 10 is placed within the opening 36 of the template 34 so the chip carrier 10 will be aligned such that each tip 18 of each lead 14 contacts a separate one of the solder spheres 28. At the same time, the template 34 serves to align the chip carrier 10 so that a separate pair of the leads 14 straddles a separate one of the alignment pins 32.

Once the tips 18 of the leads 14 have been aligned with the solder spheres 28, the template 34 is typically removed from the baseplate 22 so as to reduce the amount of mass which must be heated to reflow the solder spheres 28. The baseplate 22 and the chip carrier 10 placed thereon are then placed in an oven (not shown) for heating therein to reflow the solder spheres 28. As the solder spheres 28 are reflowed, the flux coating thereon wets the lead tips 18 so that the solder spheres stick thereto. Because the base plate 22 is made from aluminum, which has been treated with TEFLON resin, the solder spheres 28 preferentially bond to the tips 18 of the leads.

Even though the template 34 had been previously removed, the alignment pins 32 still remain in engagement with the leads 14 during the reflow of the solder spheres 28, and thus continue to constrain the chip carrier 10 against lateral movement of the baseplate 22, thereby assuring that the tips 18 of the leads remain aligned with the solder spheres. Further, after the tips 18 of the leads 14 sink approximately 10 mils into the solder spheres 28 during the reflow thereof, then the fingers 33 abut the undersurface of the chip carrier 10, thereby preventing the tips from sinking any further into the solder spheres 28.

After the reflow operation has been completed, the baseplate 22 and the chip carrier 10 are inverted. A shaft is then inserted through the hole 30 in the baseplate 20 to dislodge the chip carrier 10 therefrom. In practice, it may be desirable to place the template 34 back on the baseplate 22 about the chip carrier 10 before the latter is dislodged from the baseplate, so that the stand-offs 40 on the template can keep the chip carrier from twisting or tilting as the shaft is urged thereagainst.

After a controlled amount of solder has been applied to the tips 18 of the leads 14 of the chip carrier 10 in this manner, the chip carrier can then be soldered to a circuit board (not shown) in place of a defective component. Alternatively, the chip carrier 10 can be used to populate a bare circuit board.

Figure 3:
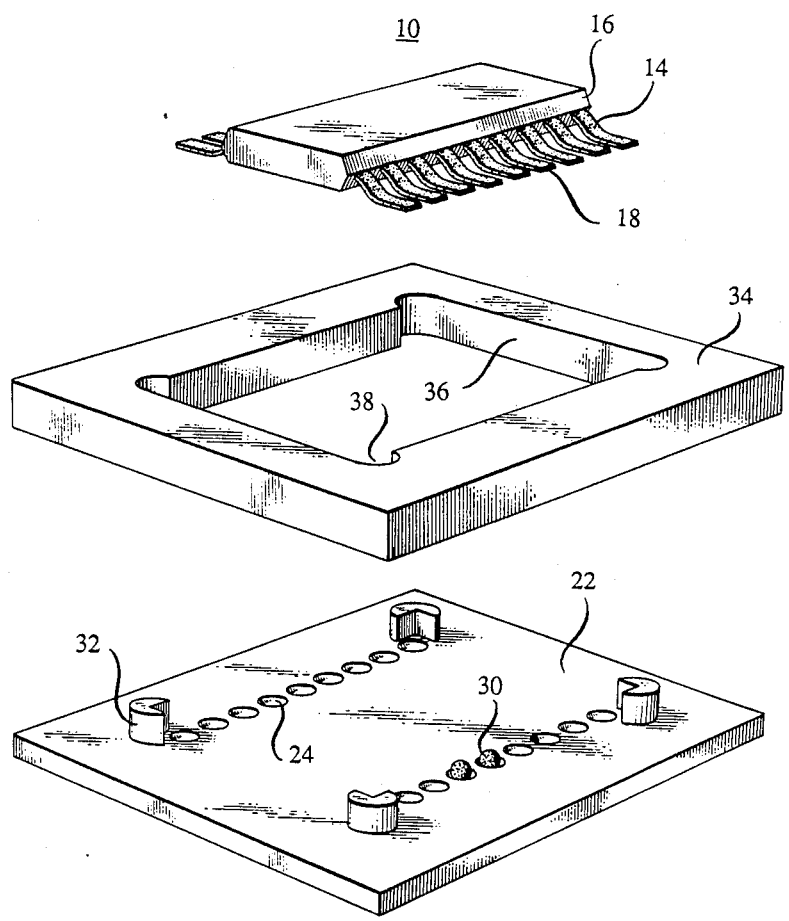
FIG. 3 is a perspective, exploded view of an alternative embodiment of the apparatus of FIGS. 1 and 2.

FIG. 3 is a perspective view of an alternative embodiment of the apparatus 20, useful for bumping each lead 14 of a "gull wing" type chip carrier 10, which derives its name from the manner in which the leads extend generally horizontally outwardly from the chip carrier side 16. Those elements of the apparatus 20 illustrated in FIG. 3 which are the same as those illustraed in FIG. 1 are referenced by the same numbers. The apparatus 20 of FIG. 3 differs in the following respects from the apparatus of FIG. 1. The alignment pins 32 associated with the apparatus 20 of FIG. 3 are each shaped so that a quarter section thereof has been cut away. Further, each alignment pin 32 of FIG. 3 is located on the baseplate 22 so as to engage (i.e., capture) a corner of the lead 14 at each corner of the gull wing chip carrier 10 when the chip carrier is placed within the central opening 36 of the template 34.

The reason for the different shape and location of the alignment pins 32 in FIG. 3 is to enable the leads 14 of the gull wing type chip carrier 10 to be engaged by the alignment pins without the need of having the pins fit between the leads. In practice, the leads 14 of the gull wing type chip carrier 10 are configured differently from those of the chip carrier of FIGS. 1 and 2, and it is undesirable to make the alignment pins 32 small enough to fit between the leads of the gull wing type chip carrier.

It is to be understood that the embodiments described herein are merely illustrative of the principles of the invention. Various modifications and changes may be made thereto by persons skilled in the art which will embody the principles of the invention and fall within the spirit and scope thereof.

What is claimed is:

1. A method of fabricating an article comprising the steps of:
    applying a controlled amount of a bonding material to the conductors on a component by placing each conductor in contact with bonding material seated in each of a set of cavities in a plate arranged in the same pattern as the conductors and then reflowing the bonding material; and thereafter
    bonding each conductor to a substrate, characterized in that:
    each conductor is a lead having a tip placed in contact with the bonding material in each cavity; and
    at least each of a pair of said leads is engaged with a separate one of a pair of alignment pins, respectively, each rising upwardly from the plate adjacent to a pair of cavities, so that the alignment pins constrain the lateral movement of the component to maintain said leads in alignment with said bonding material during the reflow thereof.

2. The method according to claim 1, characterized in that each of said pair of alignment pins engages said component after the component has descended a predetermined distance to limit the extent to which said leads sink into said bonding material during the reflow thereof.

3. The method according to claim 1, characterized in that each of said pair of leads is engaged by a separate one of said pair of alignment pins by placing said tips of the leads in contact with said bonding material such that each of a pair of said leads straddles each alignment pin.

4. The method according to claim 1, characterized in that:
    each of said pair of leads of said component is engaged by each of said pair of alignment pins by placing the tips of said leads in contact with the bonding material such that each of said alignment pins engages a corner of each of said pair of leads.

5. The method according to claim 1, characterized in that the bonding material preferentially bonds to each lead rather than to the base plate, and that following the reflow of said bonding material, said component is separated from the baseplate.

6. The method according to claim 1, characterized in that prior to placing the tips of the leads in contact with the bonding material seated in the cavities, a template is placed on said baseplate so that the pattern of cavities lies inside a central opening in the template and the alignment pins are each received in a corresponding notch in the periphery of the template central opening, and thereafter, the component is placed within the central opening of the template which aids in aligning the tips of the leads with the bonding material in each cavity.

7. A method of fabricating an article comprising the steps of:
    applying a controlled amount of a solder to the tip of each conductor of a component by placing each conductor in contact with each of a plurality of solder spheres seated in each of a plurality of cavities in a plate arranged in the same pattern as the conductor and reflowing the solder spheres; and thereafter
    solder bonding each said lead of said component to a circuit board, characterized in that:
    each conductor is a lead whose tip is placed in contact with the solder sphere in each cavity;
    prior to placing the tips of the leads in contact with the solder spheres, a template, having a central opening with notches in the periphery thereof, is placed on the baseplate such that the pattern of cavities lies within the template central opening and each of a plurality of alignment pins rising upwardly from the base plate adjacent to the cavities seats in a notch in the periphery of the central opening, the template aiding in the alignment of the tips of the leads with the solder spheres; and
    at least each of a pair of said leads is engaged with a separate one of a pair of the alignment pins when the lead tips are placed in contact with the solder spheres, so that the alignment pins constrain the lateral movement of said component, thereby maintaining said leads in alignment with the solder spheres during the reflow thereof.

8. The method according to claim 7, characterized in that each of said pair of alignment pins engages the component after the component has descended a predetermined distance to limit the extent to which said leads sink into said solder spheres during the reflow thereof.

9. The method according to claim 7, characterized in that the bonding material preferentially bonds to each lead rather than to the base plate, and that following the reflow of said bonding matrial, said component is separated from the baseplate.

10. The method according to claim 7, characterized in that each of said leads is engaged by each of said pair of alignment pins by placing said tips of the leads in contact with said solder spheres such that each of a pair of leads straddles each said alignment pin.

11. The method according to claim 7, characterized in that:
    each of said pair of leads of said component is engaged by each of said pair of alignment pins by placing the tips of said leads in contact with said solder spheres such that a corner of each lead is captured by each of said alignment pins.

12. Apparatus for applying a controlled amount of bonding material to the tip of at least one lead of a multi-lead component comprising:
    a baseplate having a plurality of cavities in a major surface thereof arranged in the same pattern as that of the leads for holding a quantity of bonding material therein, characterized in that each of a plurality of alignment pins rises upwardly from the baseplate adjacent to a pair of the cavities to engage each of a plurality of leads of said component upon the placement of the tips of the leads in contact with the bonding material in a separate one of the cavities in said baseplate to constrain the lateral movement of said component.

13. The apparatus according to claim 12, characterized in that each said alignment pin includes means thereon to engage said component to limit the distance which each said lead sinks into said bonding material during the reflow thereof.

14. The apparatus according to claim 12, characterized in that said apparatus further includes a template having a central opening therein sized to receive the component, the central opening also having a plurality of notches in the periphery thereof to accommodate each of the alignment pins when the template is placed in intimate contact with the baseplate so that the central opening in said template is in registration with said cavities.

15. A method of repairing a circuit board having at least one defective component which has each of a plurality of leads bonded to a separate one of a plurality of metallized areas on the surface of the circuit board comprising the steps of:

removing the defective component from the circuit board; and bonding each of the leads of a replacement component to the pads on the circuit board previously bonded to the defective component wherein each lead of said replacement component has a controlled amount of bonding material applied thereto by a process including the steps of:

applying a controlled amount of bonding material to the tips of each of the leads of the replacement component by placing the tips of the leads in contact with bonding material seated in each of a plurality of cavities in a plate arranged the same as the pattern of the leads; and reflowing the bonding material, characterized in that each of a pair of leads is engaged by a separate one of a pair of alignment pins, each rising upwardly from the plate, when the tips of the leads are placed in contact with the bonding material so that said alignment pins constrain the lateral movement of said component to maintain said tips of said leads in alignment with the bonding material during the reflow thereof.

16. A method for fabricating an article comprising the steps of:

applying a controlled amount of bonding material to the conductors on a component by placing each conductor in contact with bonding material seated in each of a set of cavities in a plate arranged in the same pattern as the conductors;

then reflowing the bond material; and thereafter bonding each conductor to a substrate, characterized in that:

a relative motion is imparted between the conductors on the component and the plate to bring the conductors into contact with the bonding material while simultaneously constraining the lateral movement of the conductors with alignment pins affixed to the plate so the conductors are maintained in alignment with the bonding material.

* * * * *